(12) United States Patent
Ellingboe et al.

(10) Patent No.: US 6,490,536 B1
(45) Date of Patent: Dec. 3, 2002

(54) INTEGRATED LOAD SIMULATOR

(75) Inventors: Albert R. Ellingboe, Lucan (IE);
Bruno Morel, Santa Clare, CA (US)

(73) Assignee: Lam Research Corporation, Fremont, CA (US)

( * ) Notice: Subject to any disclaimer, the term of this patent is extended or adjusted under 35 U.S.C. 154(b) by 175 days.

(21) Appl. No.: 09/661,860

(22) Filed: Sep. 14, 2000

(51) Int. Cl.⁷ .......................... C23C 16/50; G06F 15/00
(52) U.S. Cl. .................. 702/115; 702/117; 324/750; 118/723 I
(58) Field of Search .................. 702/115; 118/723 I, 118/723 MW, 663; 324/750; 204/192.13

(56) References Cited

U.S. PATENT DOCUMENTS 5,016,565 A * 5/1991 Saitoh et al. ............... 118/723

* cited by examiner

Primary Examiner—Kamini Shah
(74) Attorney, Agent, or Firm—Beyer Weaver & Thomas, LLP

(57) ABSTRACT

A load simulator and switch are connected to a power source of a plasma processing device. The switch allows the load simulator to be electrically connected to the power source to allow testing of the power source. The switch and load simulator allow the testing of the power source without mechanically removing the power source from the plasma processing device. In addition, the switch allows the connection of the load simulator to the power source while the power source is on, avoiding the requirement of turning off the power source before connecting the load simulator.

18 Claims, 6 Drawing Sheets

INTEGRATED LOAD SIMULATOR

BACKGROUND OF THE INVENTION

The present invention relates to plasma devices. More particularly, the present invention relates to an improved plasma processing device.

Plasma processing devices may be used in manufacturing. Plasma processing devices may use power systems to generate and sustain a plasma.

To facilitate discussion, FIG. 1 is a schematic view of a prior plasma processing device 10, comprising a plasma process unit 12, a pump manifold 14 supporting the plasma process unit 12, a lower transfer chamber 16 supporting the pump manifold 14, and a power source 18 connected to the lower transfer chamber 16. The plasma process unit 12, pump manifold 14, and lower transfer chamber 16 collectively form a plasma process module. The plasma process unit 12, comprises an upper electrode 20 spaced apart from a lower electrode 22. A lead 24 extends from the lower electrode 22, through the pump manifold 14 and the lower transfer chamber 16 to provide an electrical connection between the lower electrode 22 and the power source 18. An example of a power source 18 is a One Box™ radio frequency (rf) power source, which comprises a first generator 28, a second generator 30, and a match box 32 electrically connected to the first generator 28 and the second generator 30. In this example, the first generator 28 provides a 2 MHz output and the second generator 30 provides a 27 MHz output. The match box 32 may provide electrical diagnostics and impedance matching. An output connector 34 extends from the match box 32. The lead 24 is electrically connected to the output connector 34, which may be a 5 inch diameter piece of silver coated copper plug and where the lead may be connected to the output connector 34 by a screw or bolt. Nut and bolt sets 36 may provide a mechanical connection to connect the power source 18 to the lower transfer chamber 16. A bottom cover 38 covers the bottom of the lower transfer chamber 16. An interlock switch 40 is placed near the cover 38 and is electrically connected to the first generator 28 and the second generator 30, so that when the cover is removed from the lower transfer chamber 16 the interlock switch 40 causes the first generator 28 and the second generator 30 to be powered down to reduce electrical shock hazards.

In the testing of the power source 18 in the prior art, to facilitate discussion, FIG. 2 is a schematic view of a power source 18 of a plasma processing device being tested and FIG. 3 is a flow chart of the testing procedure of the power source 18.

In the testing of the power source 18, a power source problem may be suspected (step 304). The first and second generators 28, 30 may be turned off and powered down (step 308). The power source 18 may be disconnected from the plasma process module (step 312), which might take 15 to 30 minutes. To do this, the bottom cover 38 may be removed from the lower transfer chamber 16 to provide access to nut and bolt sets 36. The removal of the bottom cover 38 may trigger the interlock switch 40, which may shut down the generators 28, 30 if they are not already turned off. The nut and bolt sets 36 may be removed. Typically a power source 18 may be connected by 6 to 7 nut and bolt sets 36. In addition, the lead 24 may be disconnected from the output connector 34. The power source 18 may be moved away from the plasma process module (step 316) to create enough space to connect the load simulator 44, which might take 5–45 minutes. A load simulator 44 connected to a 50 ohm terminator 46 may be connected to the output connector 34 of the power source 18 (step 320). The generators 28, 30 may be turned on and powered up (step 324) which may take 10 minutes, to determine if there are any problems with the power source 18 (step 328). Diagnostic instruments within the first and second generators 28, 30 or within the match box 32 may be able to determine if the power source 18 is working properly, when connected to the load simulator 44.

If it is determined that the power source 18 is working correctly, then to reconnect the power source, the first and second generators 28, 30 may be powered off (step 332). The power source 18 may then be disconnected from the load simulator 44 and the power terminator 46 (step 336). The power source 18 may then be moved to the plasma process module (step 340). The lead 24 may be connected to the output connector 34. The power source 18 may then be connected to the lower transfer chamber 16 of the plasma process module (step 344). The 6 to 7 nut and bolt sets 36 may be used to complete the connection. The bottom cover 38 may be placed on the lower transfer chamber 16 to set the interlock switch 40 so that it is not triggered. The first and second generators 28, 30 may the be powered on (step 348).

The connecting and disconnecting of the power source 18 and the powering up and powering down of the generators may be time consuming and hazardous and may require a high level of expertise to be done correctly. In addition, the connecting and disconnecting of the output connector 34 and the lead 24 may cause the connection between the output connector 34 and the lead 24 to be less reliable. The many steps involved increase the chance of mistakes with high voltage and current devices.

In view of the foregoing, it is desirable to provide a simple method and apparatus for testing a power source of a plasma process device.

SUMMARY OF THE INVENTION

The invention relates, in one embodiment, to a plasma processing apparatus, comprising: a plasma process module; an electrode within the plasma process module; a switch electrically connected to the electrode; a load simulator electrically connected to the switch; a power source electrically connected to the switch, wherein the switch is electrically connected between the power source and the load simulator.

The invention relates, in a second embodiment, to a method for testing a generator in a plasma processing device while the generator is running, comprising the steps of: setting the generator to provide a near minimum (which is low or zero) power output, while the generator remains on; through a switch electrically connected to the generator, connecting a load simulator to the generator; increasing the output of the generator; and determining if the generator is providing sufficient power.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
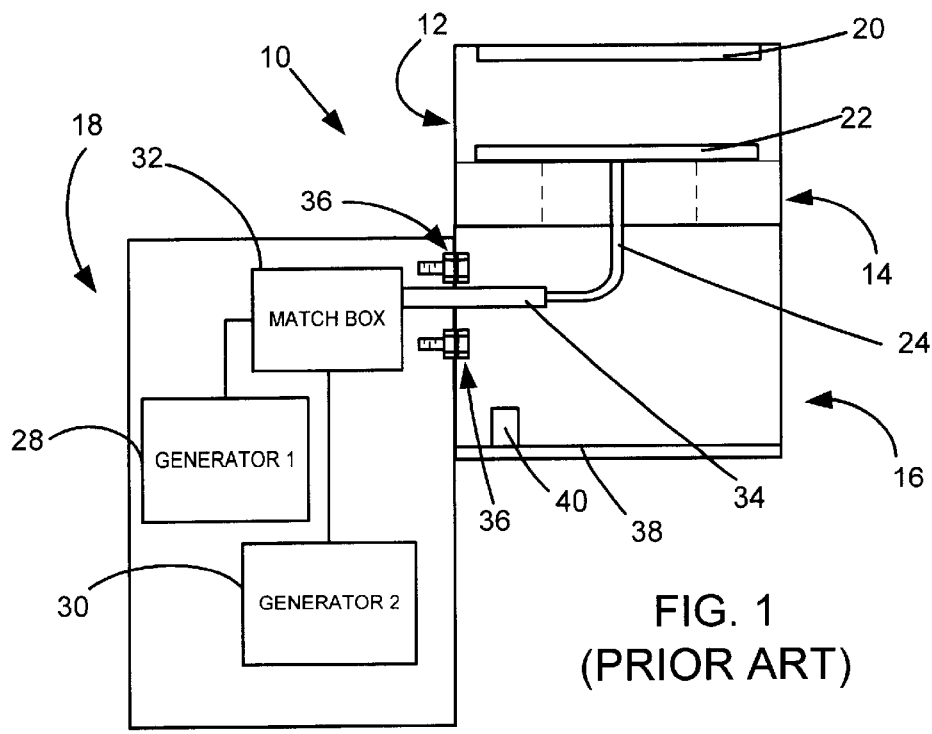
FIG. 1 is a schematic view of a prior art plasma processing device.
Figure 2:
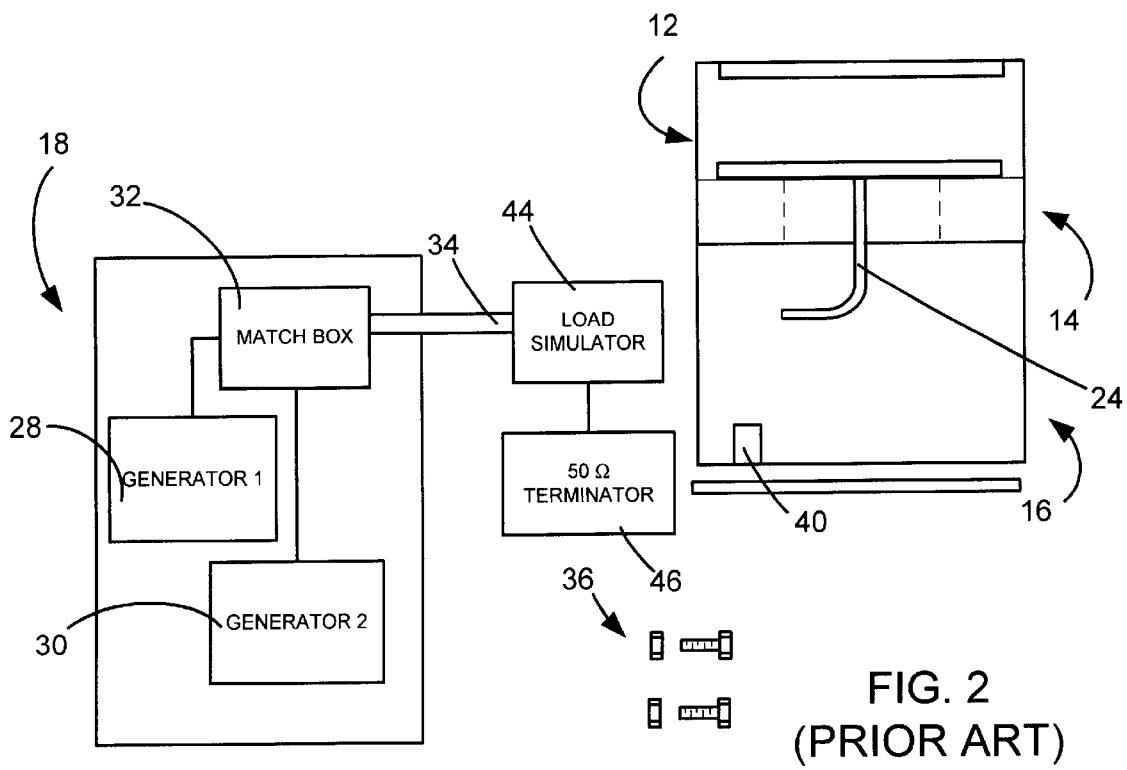
FIG. 2 is a schematic view of the prior art plasma processing device as shown in FIG. 1, with a power source which is undergoing testing.
Figure 3:
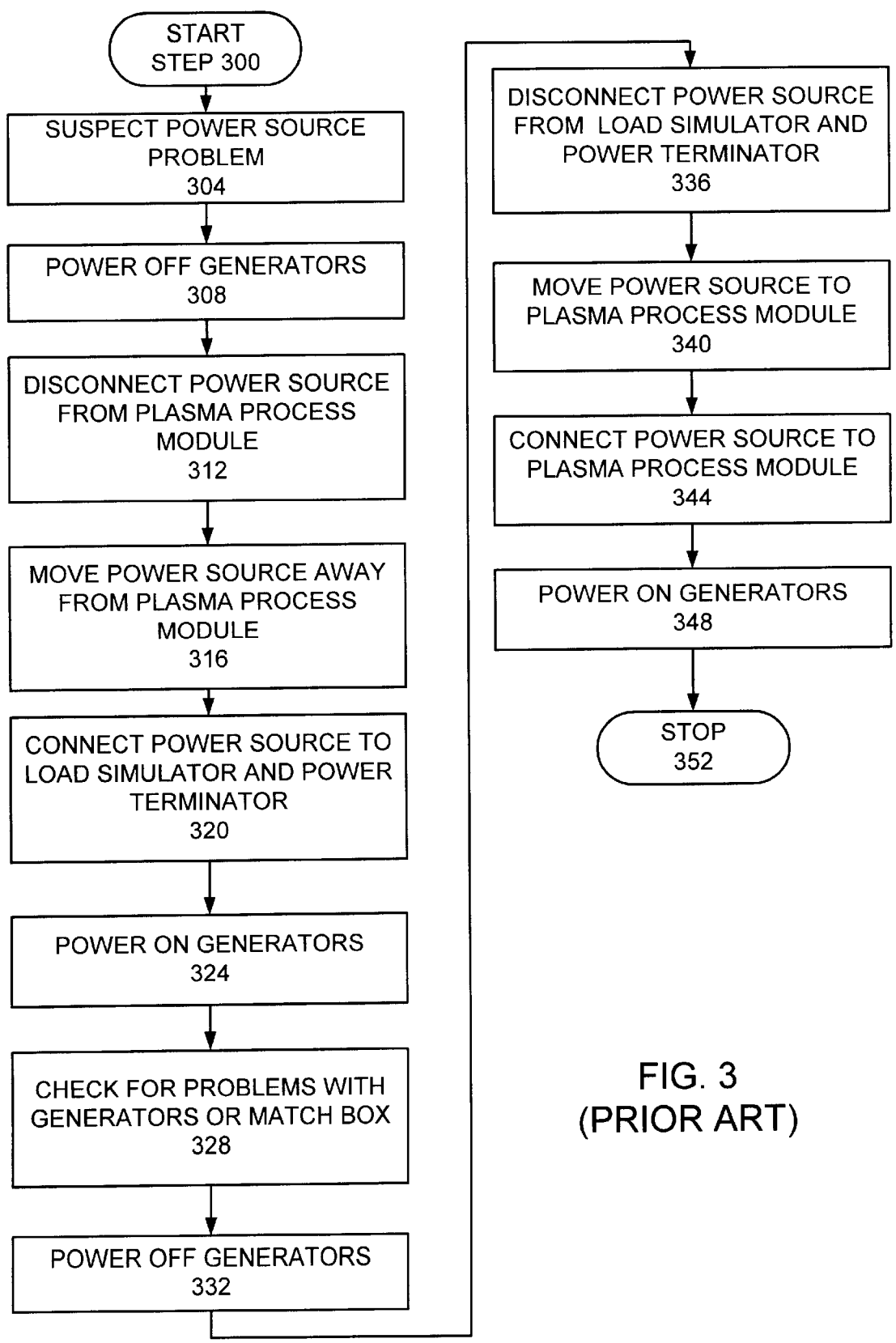
FIG. 3 is a flow chart of a power the testing of the power source according to the prior art.
Figure 4:
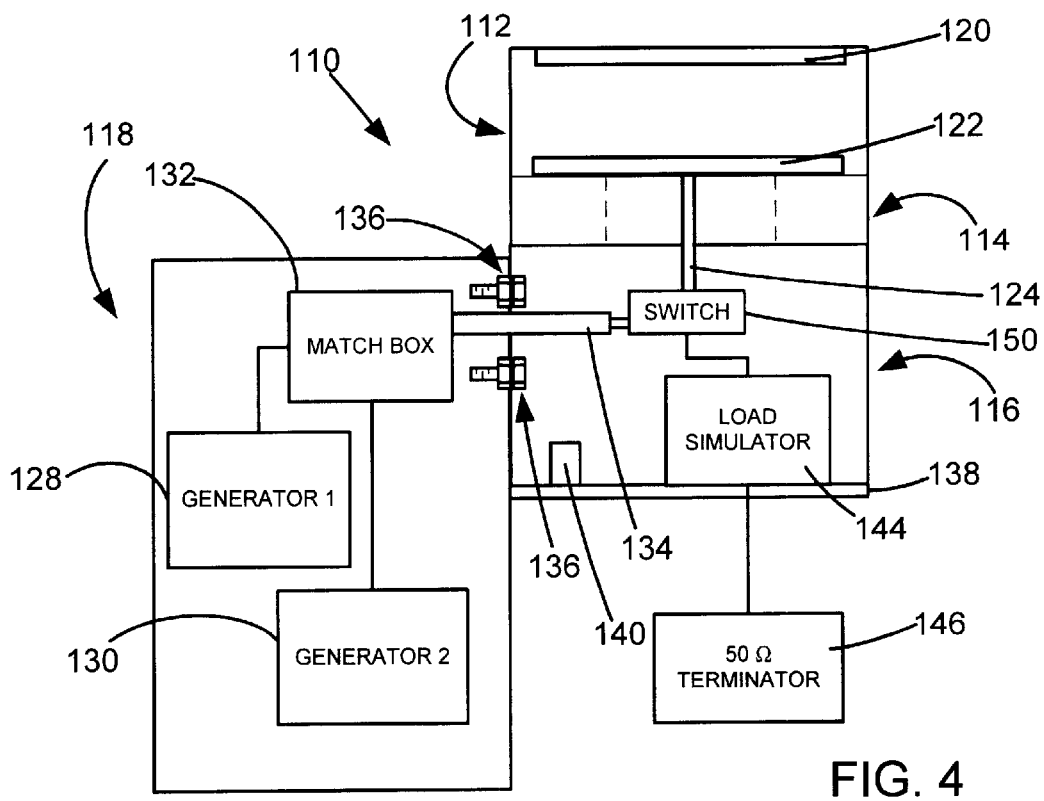
FIG. 4 is a schematic view of a preferred embodiment of the invention.

To facilitate discussion, FIG. 4 depicts a schematic view of a plasma processing device 110 used in a preferred embodiment of the invention, comprising a plasma process unit 112, a pump manifold 114 supporting the plasma process unit 112, a lower transfer chamber 116 supporting the pump manifold 114, and a power source 118 connected to the lower transfer chamber 116. The plasma process unit 112, pump manifold 114, and lower transfer chamber 116 collectively form a plasma process module. The plasma process unit 112, comprises an upper electrode 120 spaced apart from a lower electrode 122. A lead 124 extends from the lower electrode 122, through the pump manifold 114 and the lower transfer chamber 116 to provide an electrical connection between the lower electrode 122 and a first output of a switch 150 mounted within the lower transfer chamber 116. An input of the switch 150 is electrically connected to the power source 118. An example of a power source 118 is a One Box™ radio frequency (rf) power source, which comprises a first generator 128, a second generator 130, and a match box 132 electrically connected to the first generator 128 and the second generator 130. In this example, the first generator 128 provides a 2 MHz output, and the second generator 130 provides a 27 MHz output. More generally, the first generator 128 provides an output between 0.1 to 5 MHz, and the second generator 130 provides an output between 10 to 100 MHz. The match box 132 may provide various electrical diagnostics and impedance matching between the first and second generators 128, 130 and the plasma created between the upper and lower electrodes 120, 122. An output connector 134 extends from the match box 132. The switch 150 is electrically connected to the output connector 134. Nut and bolt sets 136 may provide a mechanical connection to connect the power source 118 to the lower transfer chamber 116. A bottom cover 138 covers the bottom of the lower transfer chamber 116. An interlock switch 140 is placed near the cover 138 and is electrically connected to the first generator 128 and the second generator 130, so that when the cover is removed from the lower transfer chamber 116 the interlock switch powers down the first generator 128 and the second generator 130 to reduce electrical shock hazards. A load simulator 144 is mounted within the lower transfer chamber 116. The load simulator 144 is electrically connected to a second outlet of the switch 150. A terminator 146 may be detachably connected to the load simulator 144. In the preferred embodiment, the terminator 146 is a 25 to 100 Ω terminator. More preferably, the terminator 146 is a 50 Ω terminator.

Figure 5:
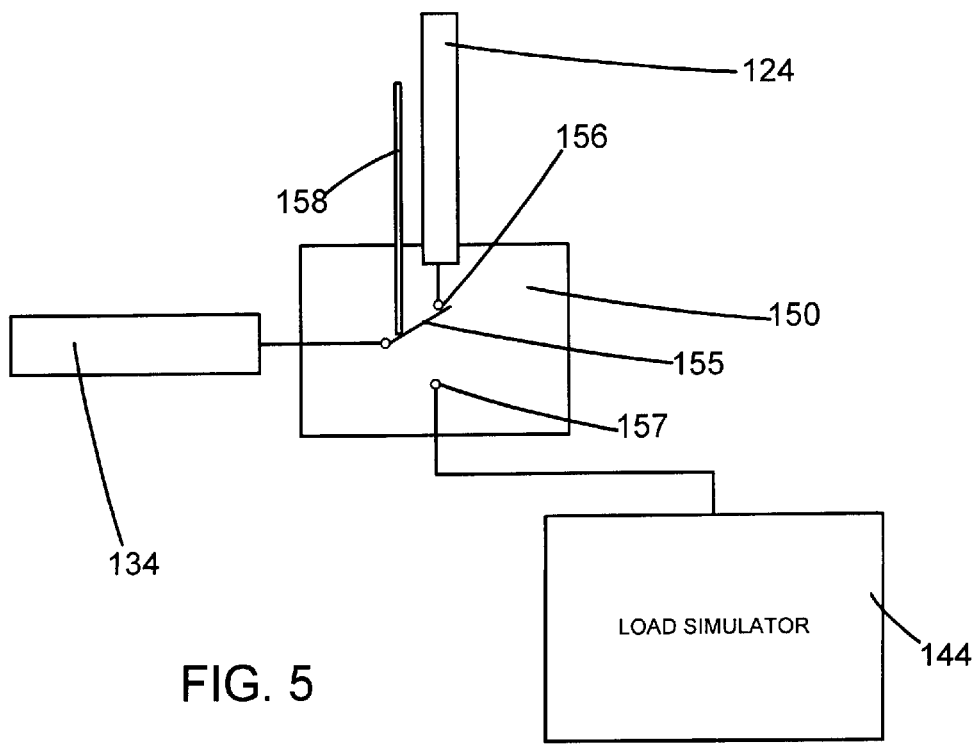
FIG. 5 is an enlarged schematic view of the switch of the embodiment illustrated in FIG. 4.

FIG. 5 is a schematic view of the switch 150. In this preferred embodiment of the invention, the switch 150 is an A to B switch. A movable contact 155 is electrically connected, to the output connector 134. A first contact 156 is electrically connected to the lead 124. A second contact 157 is electrically connected to the load simulator 144. A handle 158 is used to move the movable contact 155 from being in contact with the first contact 156 to being in contact with the second contact 157, causing the output connector 134 to go from being electrically connected to the lead 124 to being electrically connected to the load simulator 144.

Generally the plasma processing device 10 may be used by placing a substrate on the lower electrode of the plasma process unit. A gas may be flowed into the plasma process unit. The power source 118 provides power to the lower electrode 122, which may help energize the gas, creating a plasma between the upper and lower electrodes 120, 122. The plasma may be used to process the substrate by etching the substrate or depositing material on the substrate.

Figure 6:
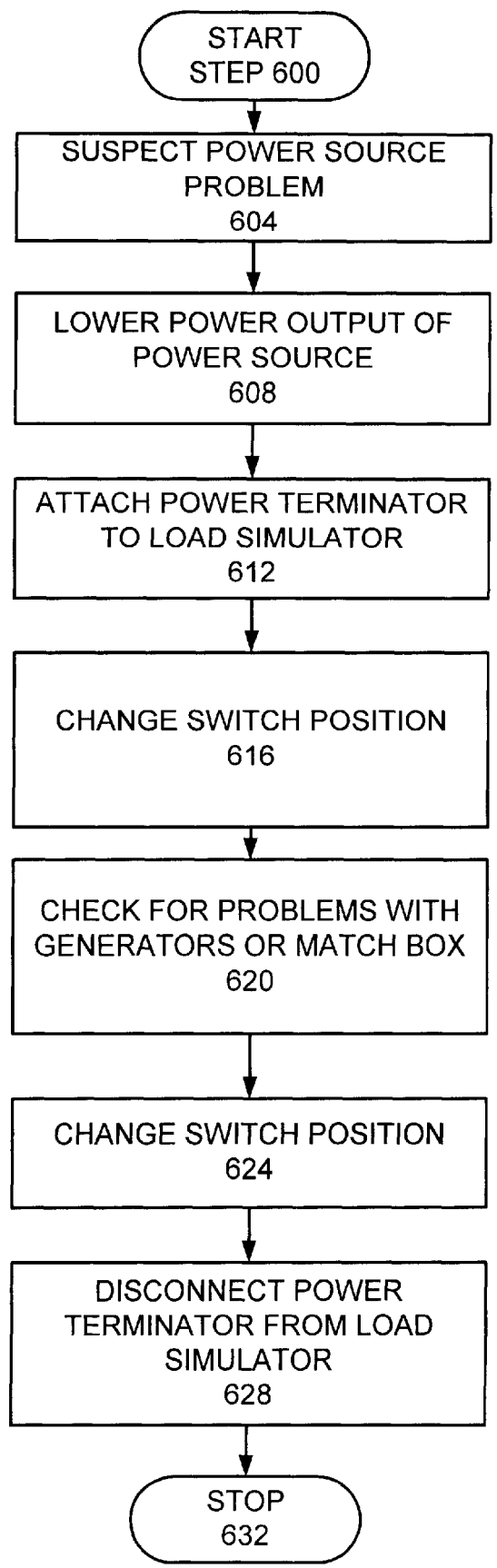
FIG. 6 is a flow chart of the power testing of a power source according to the preferred embodiment of the invention.

FIG. 6 is a flow chart of the testing procedure of the power source 118. In the testing of the power source 118, a power source problem may be suspected (step 604). The output of the power source 118 is lowered, possibly by lowering the output from the first and second generators 128, 130, while the first and second generators 128, 130 and the power source 118 remain on (step 608). The terminator 146, preferably a 50 ohm (Ω) terminator is connected to the load simulator 144, which may take 2 minutes (step 612). In the preferred embodiment, a pass through connector allows the connection between the load simulator 144 and the terminator 146 without opening any part of the plasma process module. The handle 158 moves the movable contact 155 of the switch 150, so that the movable contact 155 moves from the first contact 156 to the second contact 157, which may take 30 seconds (step 616). The switch 150 may be a mechanical switch, an electrical switch, or an electromechanical switch. The handle 158 could be a button that electrically opens a connection between the output connector 134 and the lead 124 and closes a connection between the output connector 134 and the load simulator 144. The power from the power source 118 may be increased to check for problems with the first and second generators 128, 130 and match box 132 (step 620). Diagnostic instruments within the first and second generators 128, 130 or within the match box 132 may be able to determine if the power source 118 is working properly, when connected to the load simulator 144.

If it is determined that the power source 118 is working correctly, then the power output from the power source 118 may be lowered and the handle 158 is used to move the movable contact 155 of the switch 150, so that the movable contact 155 moves from the second contact 157 to the first contact 156 (step 624). The power terminator 146 is then disconnected from the load simulator 144 (step 628).

The process for testing the power source 118 is much quicker and easier than the prior art. The use of a switch also may reduce shock hazards from manually disconnecting a power source and from making a mistake during the many extra steps in the prior art.

In the preferred embodiment of the invention, the match box takes a 50 ohm input and conditions it to drive a 1 ohm–25j ohm impedance at 27 MHz, and the load simulator takes the 1 ohm–25j ohm impedance at 27 MHz and matches it into a 50 ohm resistor. The match box also takes a 50 ohm input and conditions it to drive a 40 ohm–150j ohm impedance at 2 MHz, and the load simulator takes the 40 ohm–150j ohm impedance at 2 MHz and matches it into a 50 ohm resistor. So the load simulator reverses the match box.

Figure 7:
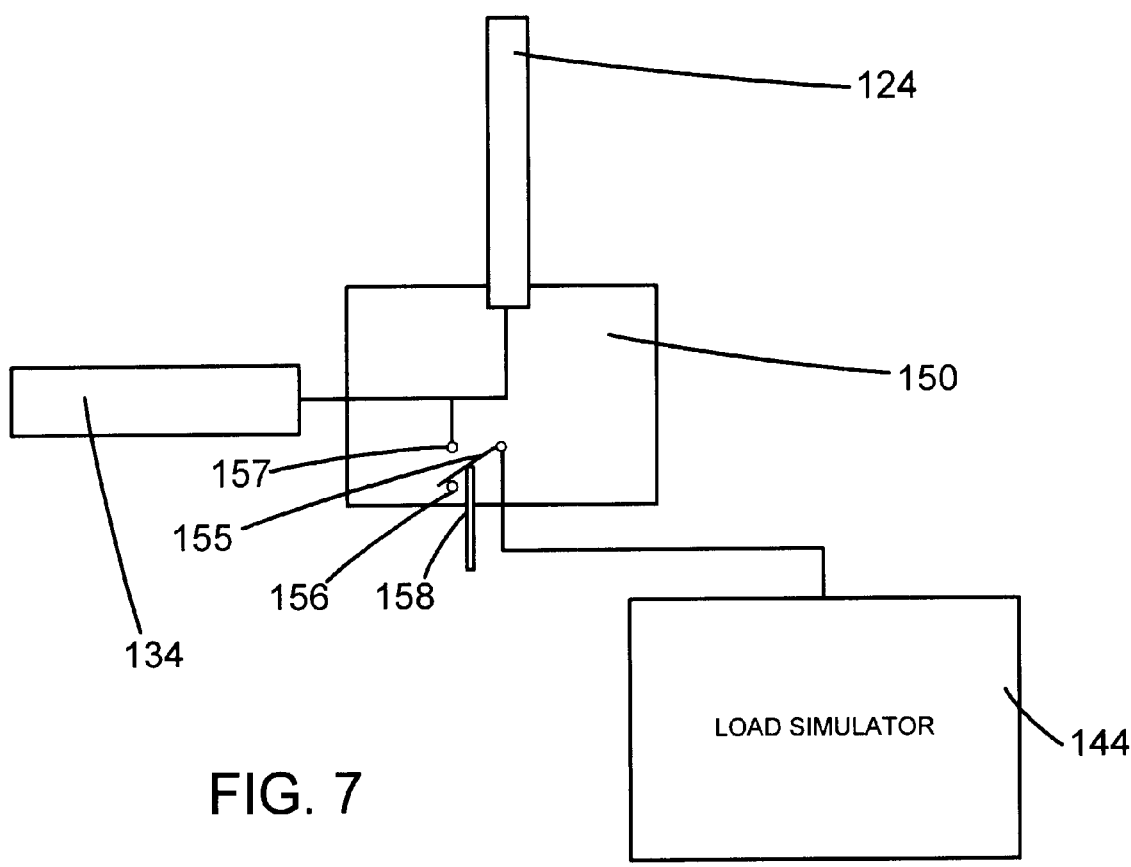
FIG. 7 is a schematic view of another switch of a preferred embodiment of the invention.

FIG. 7 is an alternative embodiment of the switch 150, where the switch is an A to A and B switch. In this embodiment, the lead 124 is electrically connected to the output connector 134. A first contact 156 is electrically isolated and a second contact 157 is electrically connected to the output connector. The movable contact 155 is electrically connected to the load simulator 144 and is moved by the handle 158 between the first contact 156 and the second contact 157. This alternative embodiment may use the same method as shown in FIG. 6.

Figure 8:
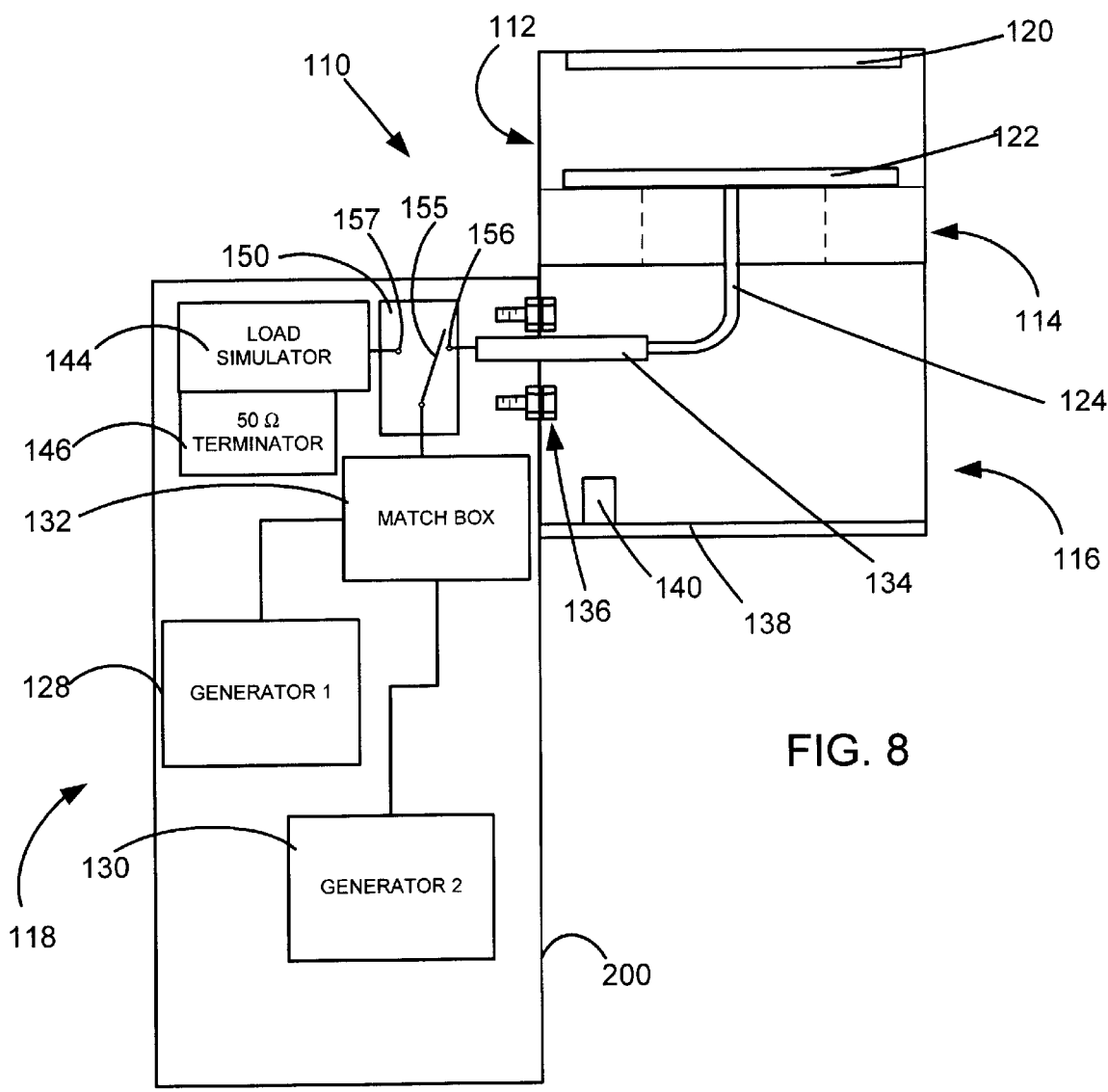
FIG. 8 is a schematic view of another embodiment of the invention.

FIG. 8 illustrates another embodiment, where a load simulator 144 and power terminator 146 are mounted in the housing 200 of the power source 118 instead of within the plasma process module. A switch 150 is also mounted in the housing 200 of the power source 118, where the switch has an input electrically connected to the match box 132, a first output electrically connected to the output connector 134 and the lead 124, and a second output electrically connected to the load simulator 144. A movable contact 155 of the switch 150 may be moved from a first contact 156, electrically connected to the lead, to a second contact 157, electrically connected to the load simulator 144, to direct the output from the match box 132 from the lower electrode 122 to the load simulator 144. Since the switch 150 is located on the output side of the match box 132, the switch 150 is electrically connected between the power source 118 and the lower electrode 122.

More generally the upper electrode 120 and lower electrode 122 form a plasma generation device, in which the upper electrode 120 and lower electrode 122 capacitively excite a plasma. More generally, a plasma generation device may comprise an antenna, which inductively excites a plasma.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing apparatus, comprising:
a plasma generation device;
a switch electrically connected to the plasma generation device;
a load simulator electrically connected to the switch; and
a power source electrically connected to the switch, wherein the switch is electrically connected between the power source and the load simulator, wherein the load simulator is for testing the power source, wherein the power source comprises:
a matchbox electrically connected to the switch; and
a first generator electrically connected to the matchbox, wherein the matchbox is electrically connected between the first generator and the switch.

2. The apparatus, as recited in claim 1, wherein the power source further comprises a second generator electrically connected to the match box.

3. The apparatus, as recited in claim 2, wherein the match box provides impedance matching between the first and second generators and a plasma generated by the plasma generation device.

4. The apparatus, as recited in claim 3, further comprising a power terminator, electrically connected to the load simulator.

5. The apparatus, as recited in claim 4, wherein the load simulator provides impedance matching between the match box and the power terminator.

6. The apparatus, as recited in claim 5, wherein the plasma generation device comprises a first electrode electrically connected to the switch and a second electrode spaced apart from the first electrode.

7. The apparatus, as recited in claim 6, wherein the power terminator provides a resistance in the range of 25 to 100 ohms.

8. The apparatus, as recited in claim 7, wherein the first generator provides a power output with a frequency in the range of 0.1 to 5 MHz and the second generator provides a power output with a frequency in the range of 10 to 100 MHz.

9. The apparatus, as recited in claim 8, wherein the switch comprises:
a movable contact electrically connected to the match box;
a device for moving the movable contact;
a first contact; and
a second contact electrically connected to the load simulator.

10. A method for testing a power source for a plasma generation device, wherein the power source comprises a generator and a matchbox, comprising the steps of:
changing a switch from a first state to a second state while the generator remains on, wherein the changing of the switch from the first state to the second state electrically connects a load simulator to the power source, wherein the matchbox is electrically connected between the generator and the switch; and
determining if the power source is working correctly.

11. A method for testing a power source for a plasma generation device, wherein the power source comprises a generator, comprising the steps of:
changing a switch from a first state to a second state while the generator remains on, wherein the changing of the switch from the first state to the second state electrically connects a load simulator to the power source;
increasing the output of the generator after the changing of the switch and before determining if the power source is working correctly; and
determining if the power source is working correctly.

12. The method, as recited in claim 11, further comprising the steps of:
lowering the output of the generator, while the generator remains on;
changing the switch from the second state to the first state, while the generator remains on, wherein the changing of the switch from the first state to the second state electrically disconnects the load simulator from the generator; and increasing the output of the generator, wherein the generator is electrically connected to the plasma generation device.

13. The method, as recited in claim 12, further comprising the steps of:

increasing the output of the second generator after changing the switch from the first state to the second state and before changing the switch from the second state to the first state, wherein the second generator is electrically connected to a match box, which is electrically connected between the first generator and the switch; and determining if the second generator and the match box are working correctly.

14. The method, as recited in claim 13, further comprising the steps of:

lowering the output from the second generator, while the second generator remains on after the step of determining if the second generator and the match box are working correctly and before the step of changing the switch from the second state to the first state; and increasing the output of the second generator after the step of determining if the second generator and the match box are working correctly and after the step of changing the switch from the second state to the first state, wherein the first generator and second generator are electrically connected to the plasma generation device through the match box.

15. The method, as recited in claim 14, further comprising the steps of:

placing a substrate in a plasma processing device comprising the plasma generation device;

providing a gas to the plasma processing device; and creating a plasma from the gas.

16. The method, as recited in claim 15, wherein when the switch is in the first state the plasma processing device is electrically connected to the match box and wherein when the switch is in the second state the plasma processing device is electrically disconnected from the match box.

17. The method, as recited in claim 10, wherein the step of determining if the plasma power source is working correctly, comprises the step of determining if the generator is working correctly.

18. The method, as recited in claim 13, wherein the step of determining if the plasma power source is working correctly, comprises the step of determining if the match box is working correctly.

* * * * *